(12) United States Patent
Lee (10) Patent No.: US 9,919,920 B1
(45) Date of Patent: Mar. 20, 2018

(54) SYSTEMS AND METHODS FOR MASK REDUCTION TECHNIQUES

(71) Applicant: InvenSense, Inc., San Jose, CA (US)

(72) Inventor: Daesung Lee, San Jose, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 15/455,877

(22) Filed: Mar. 10, 2017

(51) Int. Cl.
  *H01L 21/00* (2006.01)
  *B81C 1/00* (2006.01)
(52) U.S. Cl.
  CPC .. *B81C 1/00412* (2013.01); *B81C 2203/0792* (2013.01)
(58) Field of Classification Search
  CPC .................................. B81C 1/00412
  USPC ........................................... 438/51
  See application file for complete search history.

(56) References Cited

U.S. PATENT DOCUMENTS

2016/0221819 A1* 8/2016 Smeys .................. B81B 7/0041
2016/0318755 A1* 11/2016 Lee ....................... B81B 7/0025

* cited by examiner

*Primary Examiner* — David S Blum
(74) *Attorney, Agent, or Firm* — Duane Morris LLP; Amir Tabarrok (57) ABSTRACT

Systems and methods are provided for fabricating a microelectromechanical system (MEMS) sensor system. A first conductive layer is provided over a pad. A second conductive layer is provided over the pad, over an outgassing layer, and over a conductive bump stop structure. A first etch is performed to remove a portion of the second conductive layer over the pad. A second etch is performed, using a single mask, to remove a portion of the first conductive layer over the pad and to remove the second conductive layer over the outgassing layer.

17 Claims, 14 Drawing Sheets

SYSTEMS AND METHODS FOR MASK REDUCTION TECHNIQUES

FIELD OF THE DISCLOSURE

Certain embodiments of the disclosure relate to systems and methods that provide microelectromechanical systems (MEMS) by employing mask reduction techniques during fabrication.

BACKGROUND OF THE DISCLOSURE

MEMS are a class of devices that can be fabricated and can exhibit particular mechanical and/or electrical characteristics. For example, MEMS devices can include the ability to move or deform. In some cases, but not all, MEMS can interact with electrical signals. A MEMS device can refer to a semiconductor device that can be implemented as a microelectromechanical system. A MEMS device can include, for example, mechanical elements and/or electronics (e.g., sensor electronics). MEMS devices can include, for example, gyroscopes, accelerometers, magnetometers, pressure sensors, etc.

Limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

Systems and methods that provide MEMS by employing mask reduction techniques during fabrication are provided substantially as illustrated by and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION OF THE DISCLOSURE

As utilized herein, "and/or" means any one or more of the items in the list joined by "and/or". As an example, "x and/or y" means any element of the three-element set $\{(x), (y), (x, y)\}$. That is, "x and/or y" means "one or both of x and y." As another example, "x, y, and/or z" means any element of the seven-element set $\{(x), (y), (z), (x, y), (x, z), (y, z), (x, y, z)\}$. That is, "x, y, and/or z" means "one or more of x, y, and z." As utilized herein, the terms "e.g.," and "for example," "exemplary," and the like set off lists of one or more non-limiting examples, instances, or illustrations.

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example an electronic or MEMS device may be turned sideways so that its "top" surface is facing horizontally and its "side" surface is facing vertically, without departing from the teachings of the present disclosure.

Some embodiments according to the present disclosure include systems and methods that employ techniques that reduce the number of mask steps in a process flow for a MEMS device.

Figure 1:
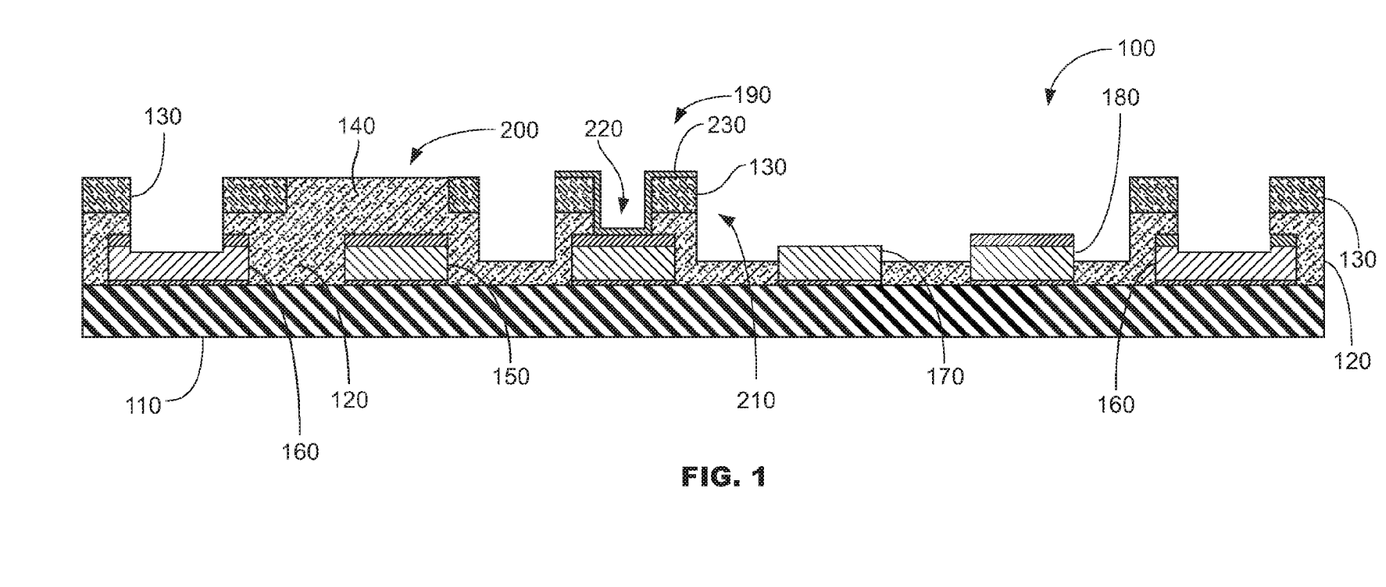
FIG. 1 shows an embodiment of a complementary metal oxide semiconductor (CMOS) wafer according to the present disclosure.

FIG. 1 shows an embodiment of a complementary metal oxide semiconductor (CMOS) wafer 100 that is configured to bond with a MEMS wafer (not shown). A MEMS device can be formed by bonding the MEMS wafer with the CMOS wafer 100. Some embodiments according to the present disclosure provide a process flow that employs an exemplary mask reduction technique can be used to create the various structures of the CMOS wafer 100.

Referring to FIG. 1, the CMOS wafer 100 can include, for example, a substrate 110, an oxide layer 120, a silicon rich oxide (SRO)/silicon nitride (SiN) layer 130, a high density plasma (HDP) oxide layer 140, and a top metal layer or AlCu layer 150. The top metal 150 (e.g., AlCu) is disposed on top of a substrate 110 of the CMOS wafer 100. A passivation stack 210, which can include the oxide layer 120 and the SRO/SiN layer 130, is formed around the top metal 150. A conductive bump stop layer 230 is disposed on top the passivation stack 210 and inside a via 220. The fabrication process will be described below.

Some of the structures of the CMOS wafer 100 include, for example, bonding electrodes 160 (e.g., bonding pads), a shield electrode 170, a shield or sensing electrode 180, a conductive bump stop 190, an outgassing layer 200, and the via 220. The CMOS wafer 100 can also include, for example, CMOS circuitry (not shown). The CMOS circuitry can be coupled to the MEMS wafer through the bonding electrodes 160. For example, the MEMS wafer can be structurally bonded and/or electrically connected to the CMOS wafer 100 through the bonding electrodes 160.

FIGS. 2A-E show an overview of an embodiment of a process flow according to the present disclosure. Some embodiments provide that the process flow integrates a conductive layer 230 on a passivation 210 and electrode layer 240 on top metal 150, such as AlCu, in a CMOS-MEMS bonding structure.

Figure 2A:
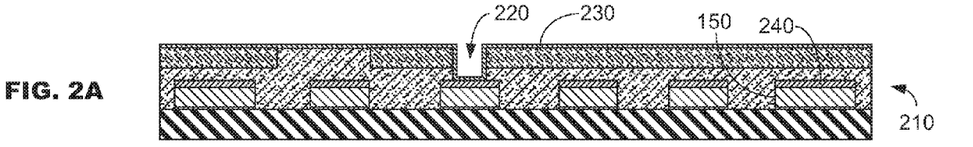
FIG. 2A shows an exemplary process step including via formation and conductive layer deposition in an embodiment of a process flow according to the present disclosure.

In the overview of the process flow, FIG. 2A shows the step of via 220 formation in the passivation stack 210 and the deposition of a conductive layer 230 over the passivation 210 and electrode layer 240 and over the via 220.

Figure 2B:
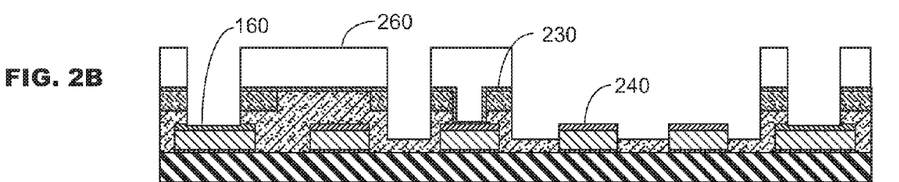
FIG. 2B shows an exemplary process step including lithography and etching in an embodiment of a process flow according to the present disclosure.

FIG. 2B shows PAD lithography and etch. The photoresist (PR) 260 is deposited (e.g., a first PR 260 deposition) on the conductive layer 230 and then patterned. Then, the conductive layer 230 and the passivation stack 210 are selectively etched. In some places, the etch is stopped at the electrode layer 240 on AlCu (top metal 150). In some embodiments, the etch removes a portion, but not all, of the bond electrode 160 in the vertical direction. In some embodiments, the PR 260 is removed after the etch.

Figure 2C:
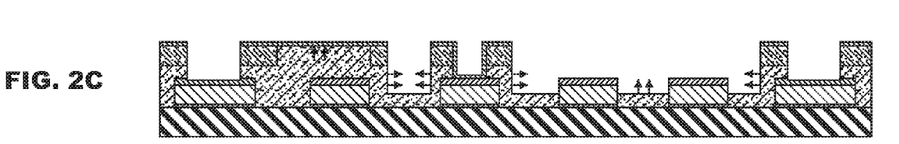
FIG. 2C shows an exemplary process step including an alloy step in an embodiment of a process flow according to the present disclosure.

FIG. 2C shows an alloy step. The arrows in FIG. 2C indicate outgassing that occurs during the alloy step.

Figure 2D:
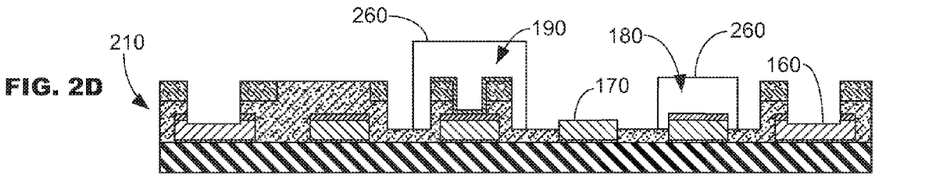
FIG. 2D shows an exemplary process step including lithography and etching in an embodiment of a process flow according to the present disclosure.

FIG. 2D shows another lithography and etch. PR 260 is deposited (e.g., a second PR 260 deposition) and patterned to selectively protect the conductive bump stop 190 and the shield/sensing electrode 180. The lithography and etch are employed to pattern the conductive layer on the passivation stack 210 and the electrode layer 240 on AlCu in the same step. In some embodiments, the electrode layer 240 in FIG. 2C is removed from the shield electrode 170 as well as the rest of the electrode layer 240 from the bonding electrodes 160, for example. In some embodiments, the PR 260 is removed after the etch.

Figure 2E:
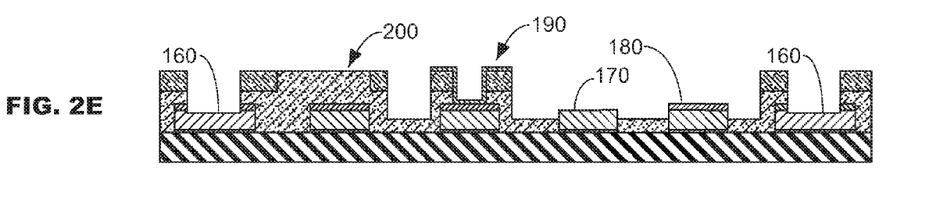
FIG. 2E shows an exemplary process step including configuring the CMOS wafer for bonding with a MEMS wafer in an embodiment of a process flow according to the present disclosure.

FIG. 2E shows the resulting CMOS wafer 100 which is ready for bonding with a MEMS wafer.

FIGS. 3A-F show an overview of another embodiment of a process flow according to the present disclosure.

Figure 3A:
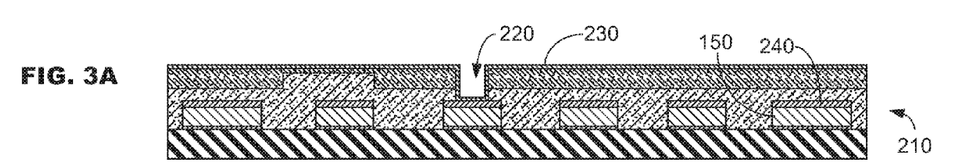
FIG. 3A shows an exemplary process step including via formation and conductive layer deposition in an embodiment of a process flow according to the present disclosure.

In the overview of the process flow, FIG. 3A shows the step of via 220 formation in the passivation stack 210 and the deposition of a conductive layer 230 over the passivation 210 and electrode layer 240 and over the via 220.

Figure 3B:
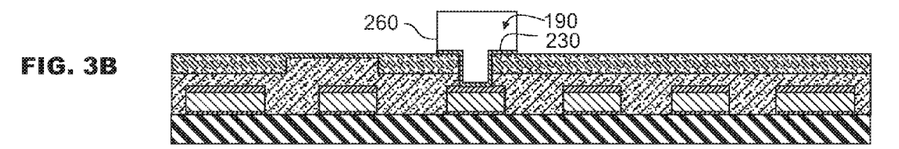
FIG. 3B shows an exemplary process step including lithography and etching in an embodiment of a process flow according to the present disclosure.

FIG. 3B shows a lithography and etch step. PR 260 is deposited on the conductive layer 230 and then patterned.

Then, the conductive layer 230 is selectively etched such that only the conductive layer 230 over the conductive bump stop 190 remains.

Figure 3C:
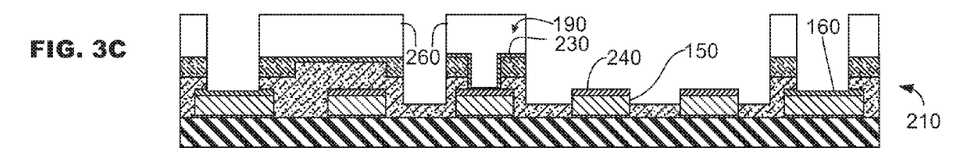
FIG. 3C shows an exemplary process step including lithography and etching in an embodiment of a process flow according to the present disclosure.

FIG. 3C is another lithography and etch step. PR 260 over the conductive bump stop 190 is left in place, and additional PR 260 is deposited and patterned. Then, the passivation stack 210 is selectively etched. In some places, the etch is stopped at the electrode layer 240 on AlCu (top metal 150). In some embodiments, the etch removes a portion, but not all, of the bond electrode 160 in the vertical direction.

Figure 3D:
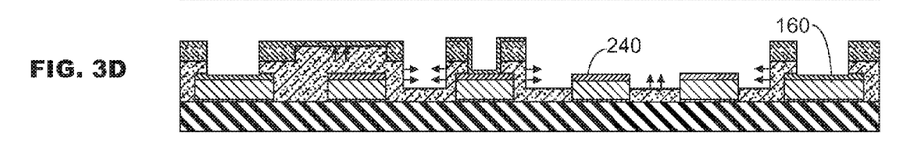
FIG. 3D shows an exemplary process step including an alloy step in an embodiment of a process flow according to the present disclosure.

FIG. 3D shows an alloy step. The arrows in FIG. 3D indicate outgassing that occurs during the alloy step.

Figure 3E:
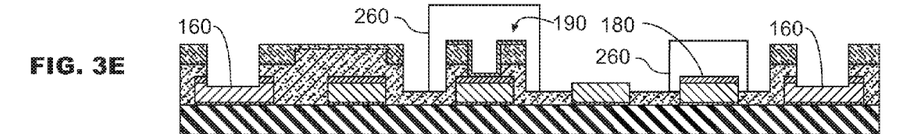
FIG. 3E shows an exemplary process step including lithography and etching in an embodiment of a process flow according to the present disclosure.

FIG. 3E shows another lithography and etch. The PR 260 is deposited and patterned to selectively protect the conductive bump stop 190 and the shield/sensing electrode 180. In some embodiments as shown in FIG. 3E, the electrode layer 240 in FIG. 3D is removed from the shield electrode 170 as well as the rest of the electrode layer 240 from the bonding electrodes 160, for example.

Figure 3F:
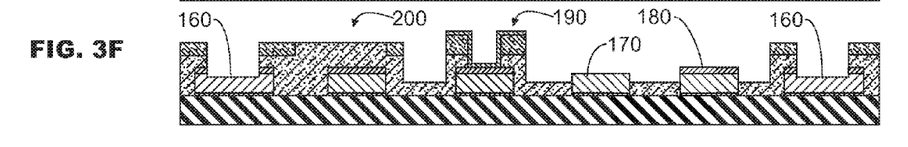
FIG. 3F shows an exemplary process step including configuring the CMOS wafer for bonding with a MEMS wafer in an embodiment of a process flow according to the present disclosure.

FIG. 3F shows the resulting CMOS wafer 100 which is ready for bonding with a MEMS wafer.

Although the end result is similar in FIGS. 2E and 3F, a comparison of the process flow shown in FIGS. 2A-E and FIGS. 3A-F reveals that the process flow in FIGS. 3A-F employs one more mask or mask step than the process flow in FIGS. 2A-E. The lithography and etch steps in FIGS. 2B and 2D use two masks or two mask steps. In contrast, the lithography and etch steps in FIGS. 3B, 3C, and 3E use three masks or three mask steps. Thus, the process flow according to some embodiments of the present disclosure as shown in FIGS. 2A-E reduces the process flow by one mask step or saves one mask.

FIGS. 4A-J show in further detail an embodiment of a process flow according to the present disclosure.

Figure 4A:
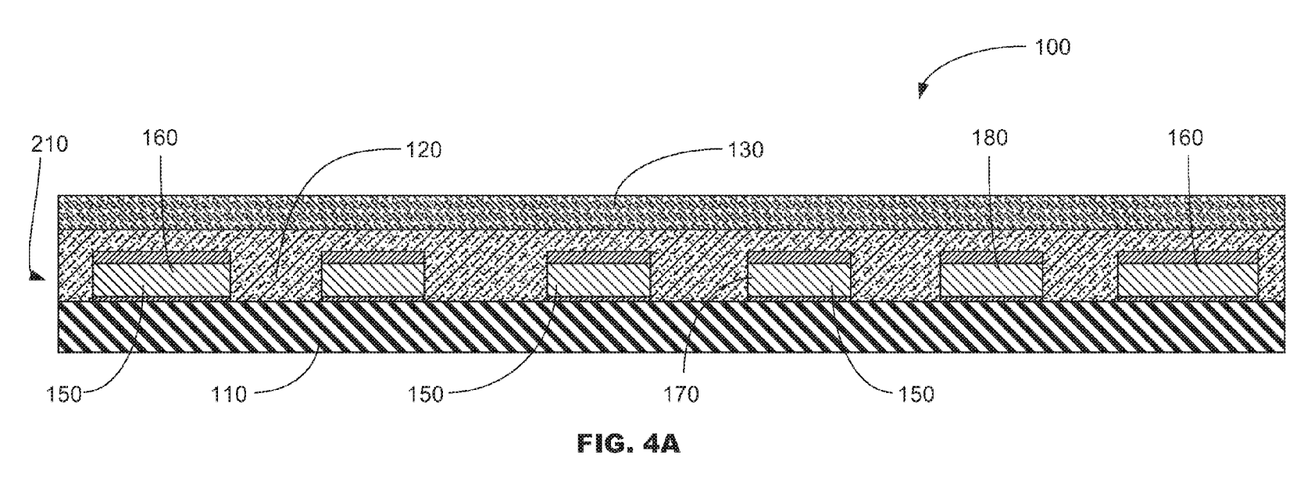
FIG. 4A shows an exemplary process step including passivation deposition in an embodiment of a process flow according to the present disclosure.

Referring to FIG. 4A, electrodes 160, 170, 180 are formed by depositing a top metal layer 150 on a substrate 110 of the CMOS wafer 100. A passivation stack 210 is formed over the top metal 150 (e.g., AlCu). In some embodiments, the passivation stack can include, for example, an oxide layer 120 and/or an SRO/SiN layer 130.

Figure 4B:
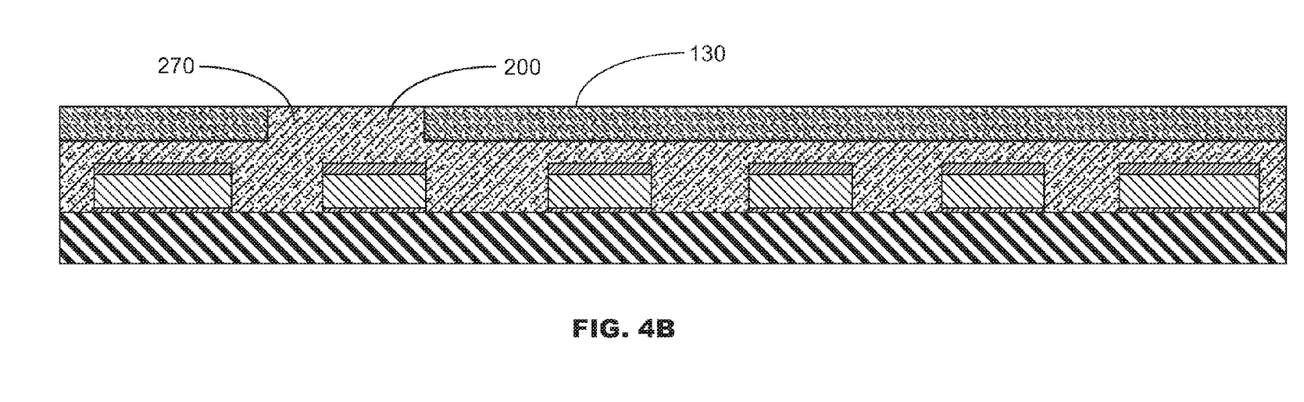
FIG. 4B shows an exemplary process step including providing an outgassing layer in an embodiment of a process flow according to the present disclosure.

In FIG. 4B, an outgassing layer 200 (e.g., HDP oxide) is provided. In some embodiments, an HDP oxide mask is used and a SiN/SRO layer 130 etch is performed to remove SiN/SRO from area 270. The outgassing layer 200 can be formed by HDP oxide deposition in the etched area 270 and chemical-mechanical polishing (CMP).

Figure 4C:
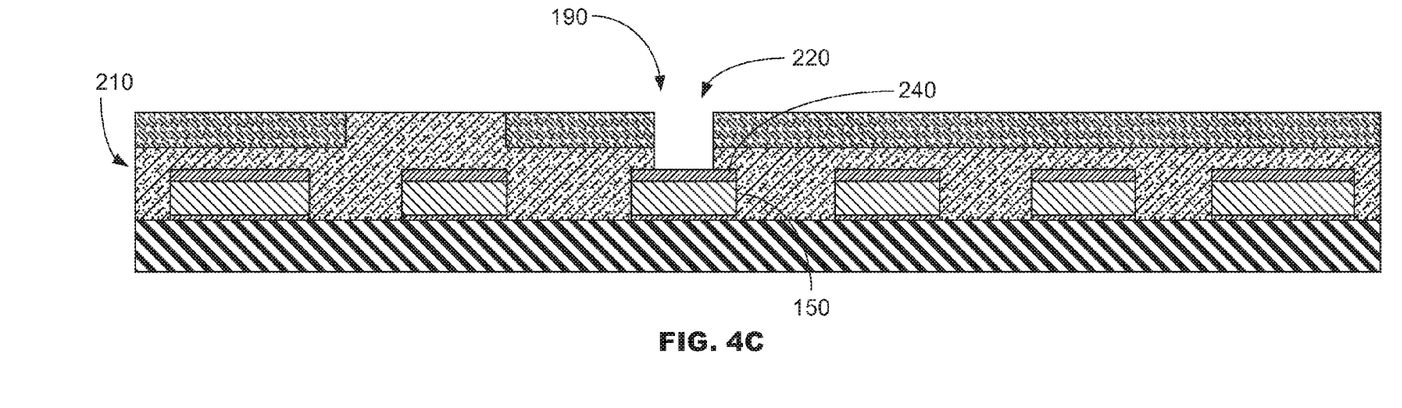
FIG. 4C shows an exemplary process step including via formation in an embodiment of a process flow according to the present disclosure.

In FIG. 4C, a via 220 is formed. In some embodiments, the via 220 is formed through the passivation stack 210 of the bump stop 190 to the electrode layer 240 on top of the top metal 150 (e.g., AlCu).

Figure 4D:
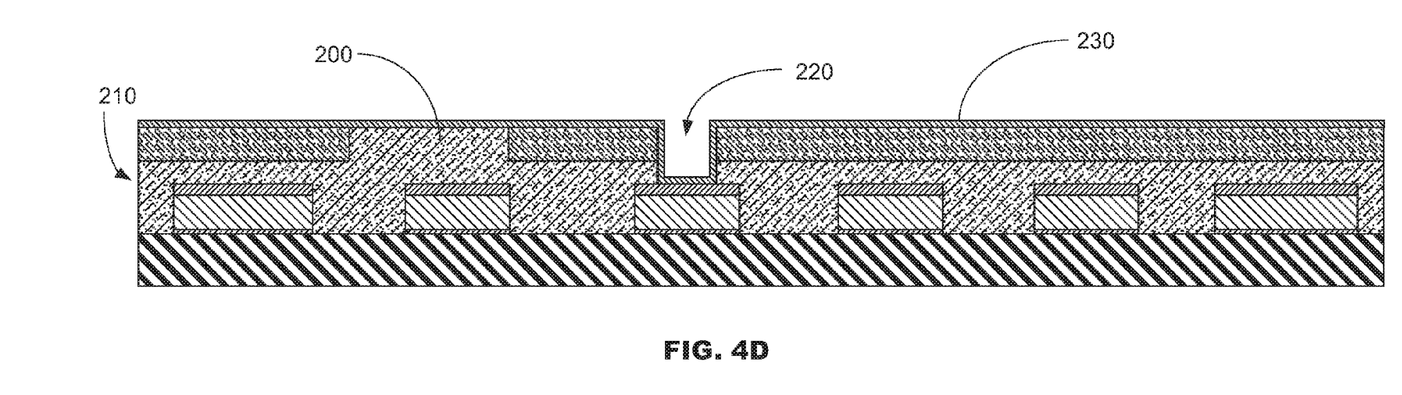
FIG. 4D shows an exemplary process step including conductive bump stop layer deposition in an embodiment of a process flow according to the present disclosure.

In FIG. 4D, a conductive bump stop layer 230 (e.g., Ti/TiN) is deposited. In some embodiments, the conductive bump stop layer 230 is deposited over the passivation stack 210, the outgassing layer 200, and the via 220.

Figure 4E:
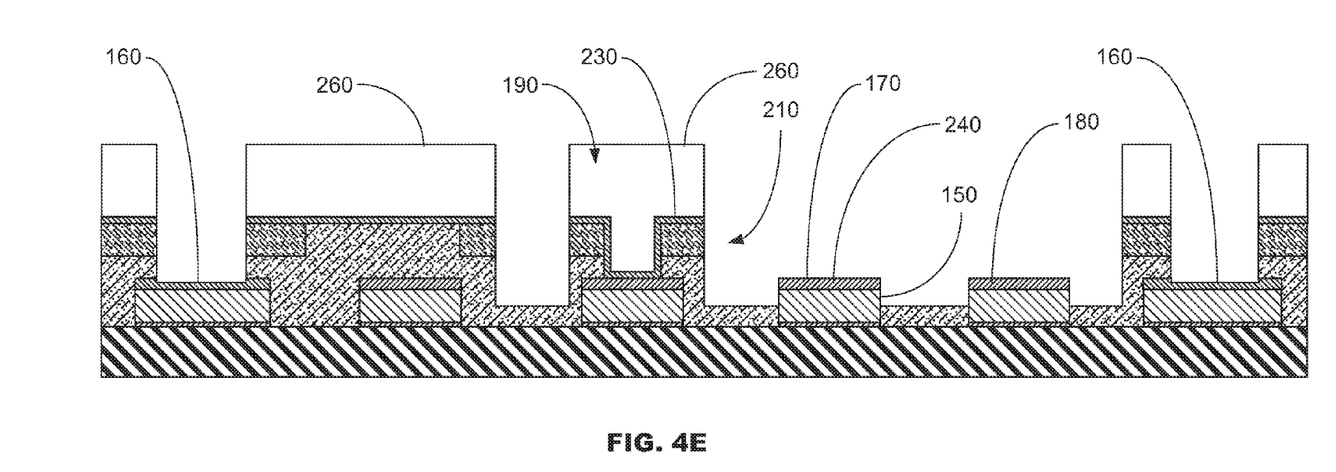
FIG. 4E shows an exemplary process step including lithography and etching in an embodiment of a process flow according to the present disclosure.

In FIG. 4E, a PAD lithography and etch step is performed after the conductive layer 230 deposition. In some embodiments, the PR 260 is deposited on top of the conductive bump stop layer 230 and the passivation stack 210, and patterned. The conductive bump stop layer 230 and the passivation stack 210 (e.g., SiN/SRO/oxide) are selectively etched using the PR mask/pattern. The etch is stopped at the electrode layer 240 on the top metal 150 (e.g., AlCu). In some embodiments, the etch is stopped after removing a portion of the electrode layer 240 of the bonding electrodes 160 in the vertical direction. The PAD lithography and etch step defines the final bump stop structure 190 and exposes bonding, shield, and sensing electrodes 160, 170, 180.

Figure 4F:
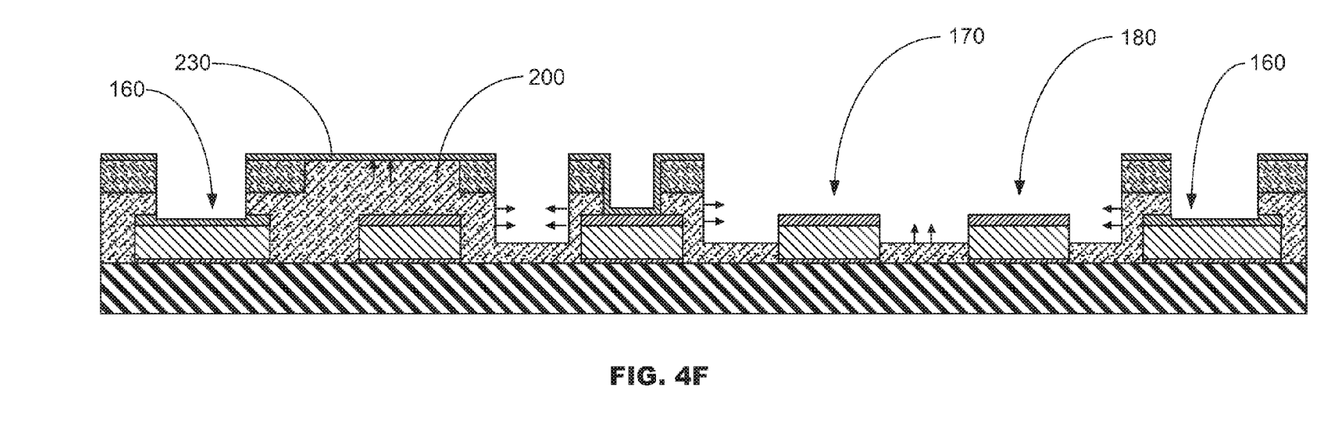
FIG. 4F shows an exemplary process step including a photoresist strip and an alloy step in an embodiment of a process flow according to the present disclosure.

In FIG. 4F, the PR 260 (shown in FIG. 4E) is stripped and the alloy step is performed. During the alloy step, the capping conductive bump stop layer 230 partially or completely blocks the outgassing from the outgassing layer 200 (e.g., HDP oxide). The arrows in FIG. 4F indicate the direction of outgassing during the alloy step.

Figure 4G:
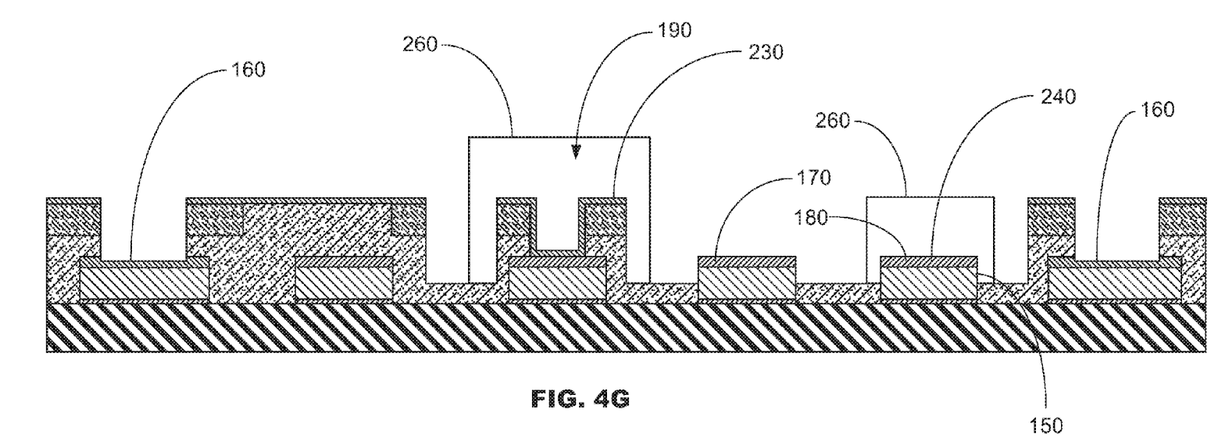
FIG. 4G shows an exemplary process step including lithography in an embodiment of a process flow according to the present disclosure.

In FIG. 4G, lithography is performed for the conductive bump stop layer 230 and the electrode layer 240 on the top metal layer 150 (e.g., AlCu). In some embodiments, the PR 260 is deposited and patterned to selectively protect the predefined conductive bump stop structures 190 and the electrode layer 240 on AlCu (e.g., top metal layer 150) for defining bonding or sensing and/or shield electrodes 160, 170, 180.

Figure 4H:
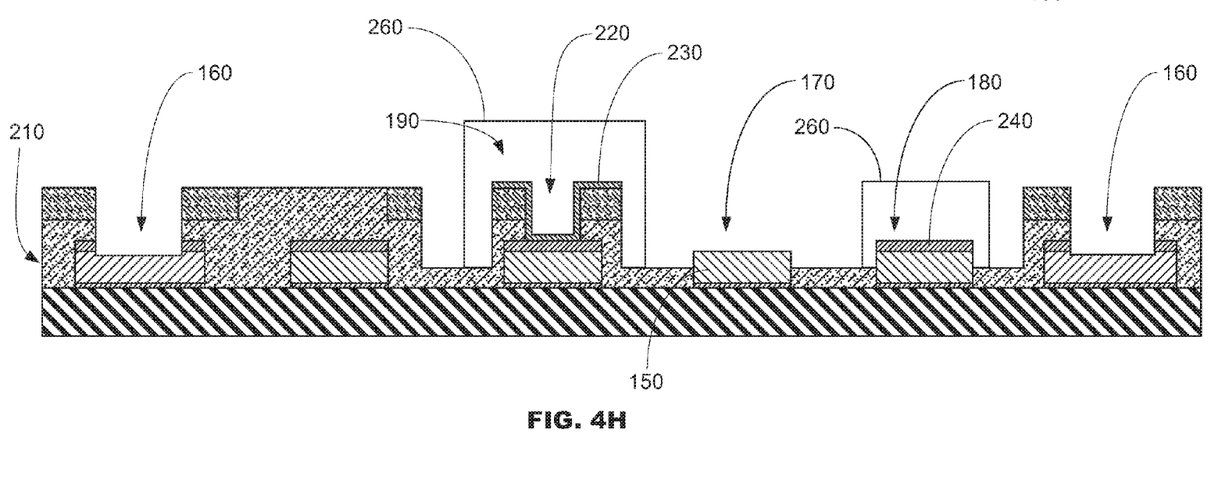
FIG. 4H shows an exemplary process step including etching in an embodiment of a process flow according to the present disclosure.

In FIG. 4H, another etch is performed. In some embodiments, this etch step relates to selectively etching the conductive bump stop layer 230 and the electrode layer 240. In some embodiments, the floating conductive bump stop layer 230 on passivation 210 (not connected to top metal 150 through via 220) is removed. The capping conductive bump stop layer 230 is also removed to expose the outgassing layer 200 underneath. Further, the electrode layer 240 on the top metal layer 150 (e.g., AlCu) is removed to define bonding electrodes 160 and/or shield electrodes 170. The conductive bump stop layer 230 that is part of the conductive bump stop 190 and the electrode layer 240 of the shield/sensing electrode 180 remain.

Figure 4I:
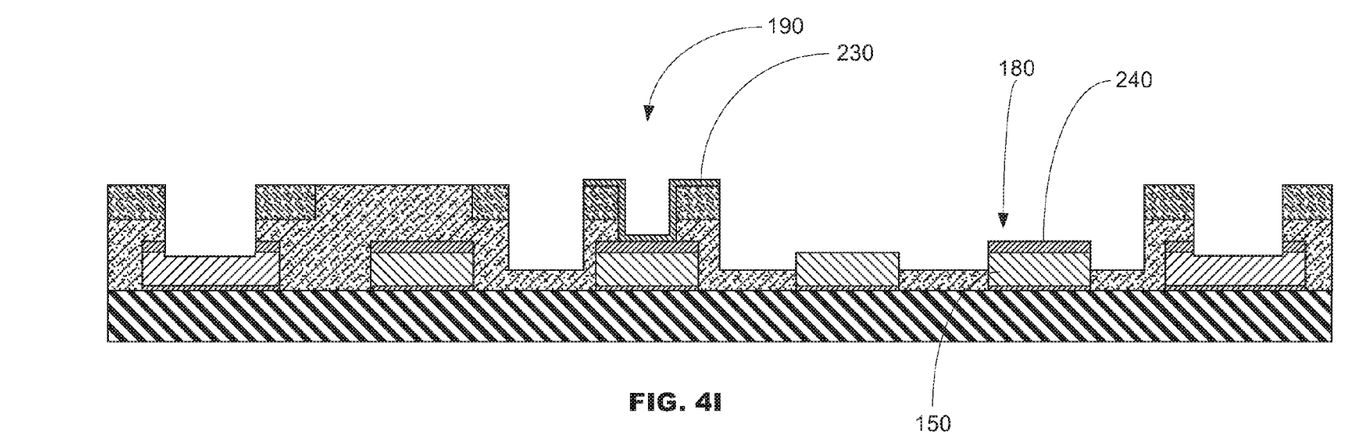
FIG. 4I shows an exemplary process step including a photoresist strip in an embodiment of a process flow according to the present disclosure.

In FIG. 4I, the PR 260 is stripped. In some embodiments, the PR 260 that was patterned to selectively protect the conductive bumpstop layer 230 of the conductive bump stop 190 and the electrode layer 240 of the shield/sensing electrode 180 is finally removed.

Figure 4J:
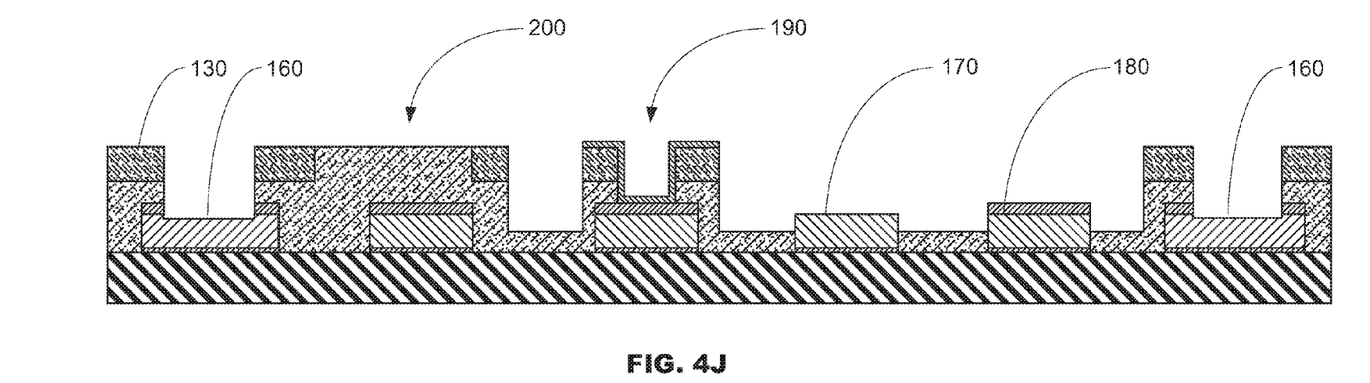
FIG. 4J shows an exemplary process step including readying wafer for bonding in an embodiment of a process flow according to the present disclosure.

After this step, the CMOS wafer 100 as shown in FIG. 4J is ready for bonding with the MEMS wafer.

FIGS. 5A-L show in further detail another embodiment of a process flow according to the present disclosure.

Figure 5A:
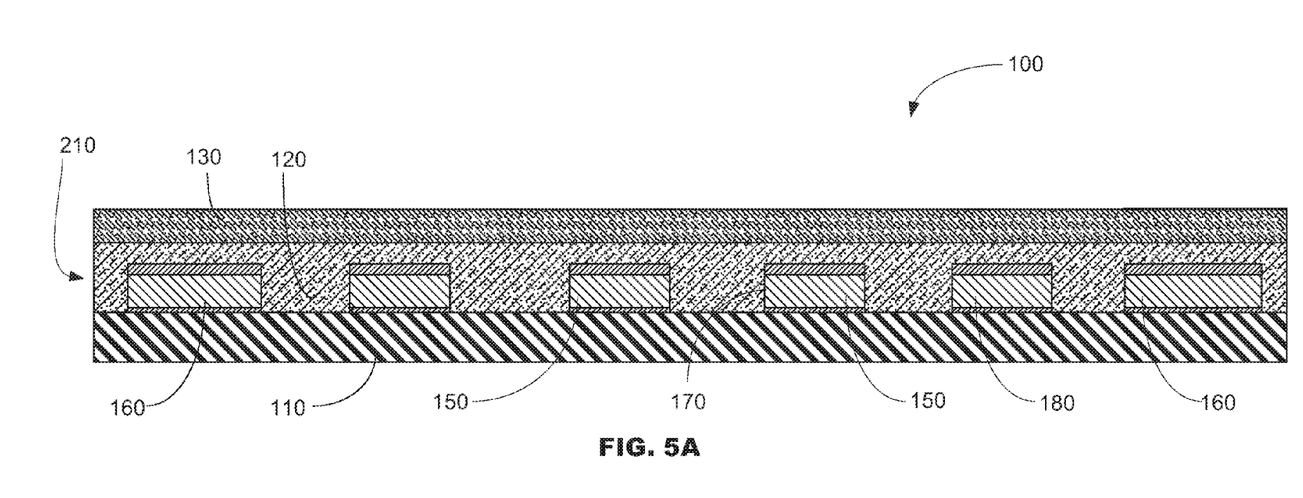
FIG. 5A shows an exemplary process step including passivation deposition in an embodiment of a process flow according to the present disclosure.

Referring FIG. 5A, electrodes 160, 170, 180 are formed by depositing a tap metal layer 150 on a substrate 110 of the CMOS wafer 100. A passivation stack 210 is formed over the top metal 150 (e.g., AlCu). In some embodiments, the passivation stack 210 can include, for example, an oxide layer 120 and/or an SRO/SiN layer 130.

Figure 5B:
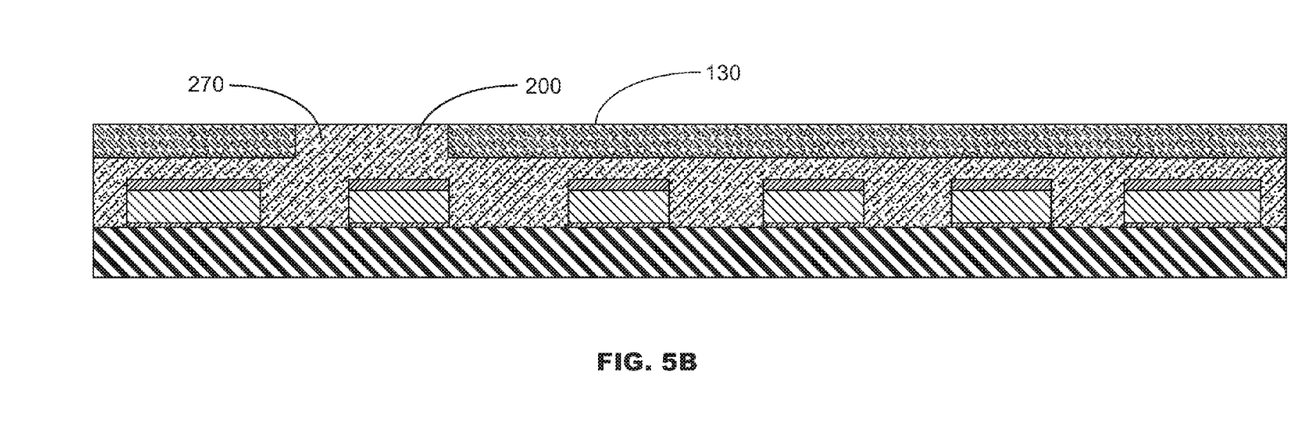
FIG. 5B shows an exemplary process step including providing an outgassing layer in an embodiment of a process flow according to the present disclosure.

In FIG. 5B, an outgassing layer 200 (e.g., HDP oxide) is provided. In some embodiments, an HDP oxide mask is used, and a SiN/SRO etch is performed to remove SiN/SRO from area 270. The outgassing layer can be formed by HDP oxide deposition in the etched area 270 and chemical-mechanical polishing (CMP).

Figure 5C:
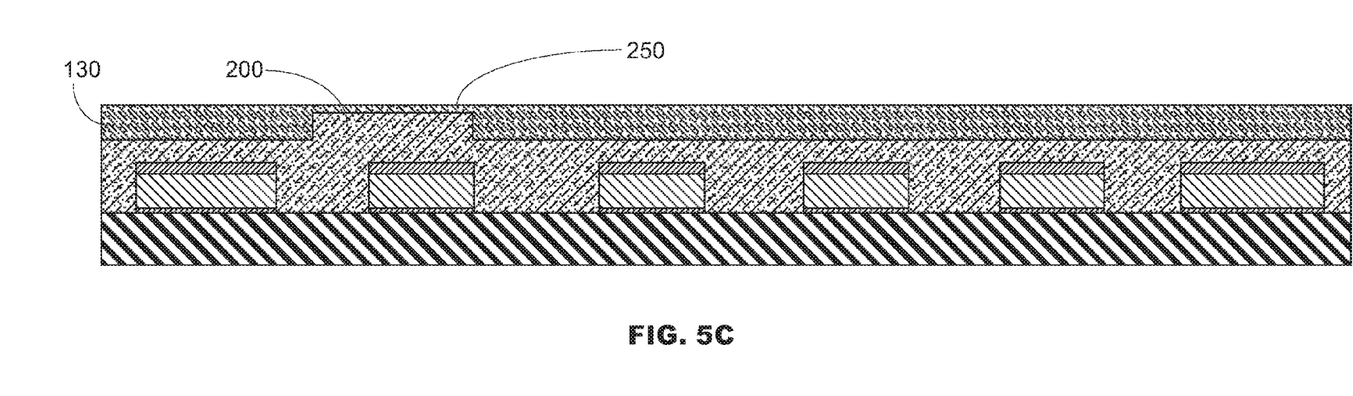
FIG. 5C shows an exemplary process step including outgassing barrier deposition in an embodiment of a process flow according to the present disclosure.

In FIG. 5C, an outgassing barrier layer 250 is formed over the outgassing layer 200. In some embodiments, the outgassing barrier layer comprises SiN, and it is formed not only over the outgassing 200, but also the SRO/SiN layer 130.

Figure 5D:
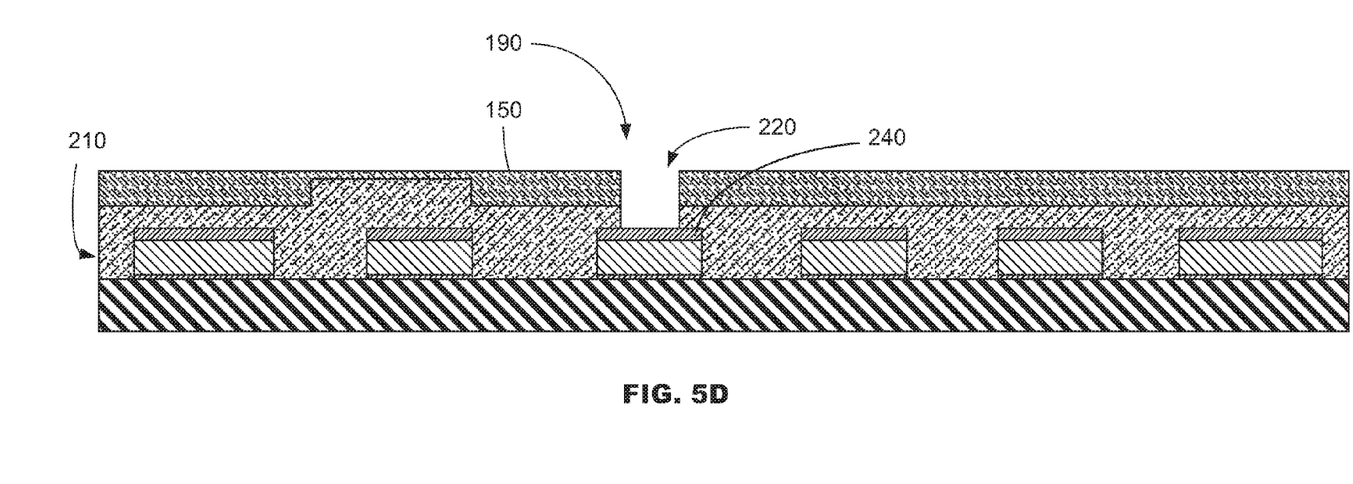
FIG. 5D shows an exemplary process step including via formation in an embodiment of a process flow according to the present disclosure.

In FIG. 5D, a via 220 is formed. In some embodiments, the via 220 is formed through the passivation stack 210 of the bump stop 190 to the electrode layer 240 on top of the top metal 150 (e.g., AlCu).

Figure 5E:
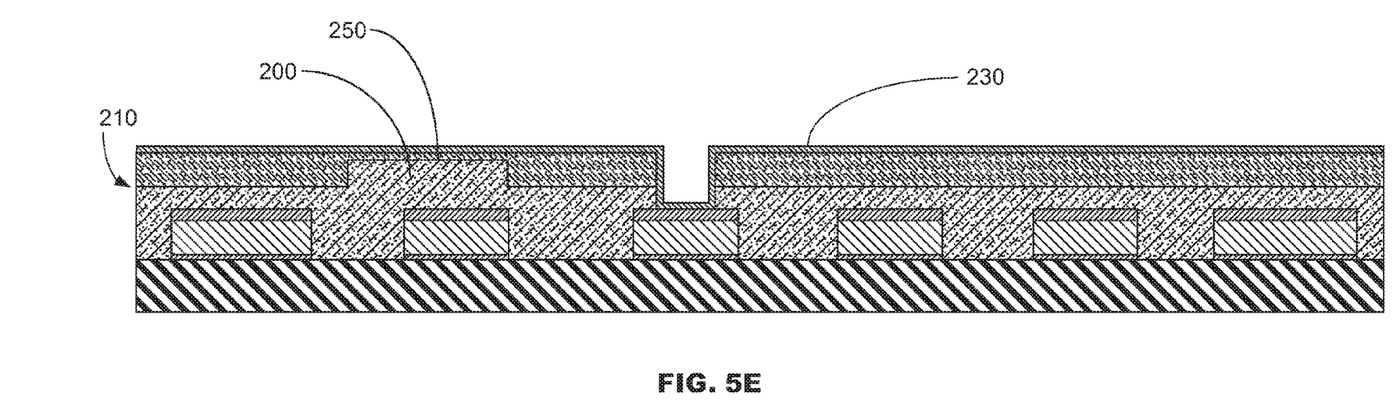
FIG. 5E shows an exemplary process step including conductive bump stop layer deposition in an embodiment of a process flow according to the present disclosure.

In FIG. 5E, a conductive bump stop layer 230 (e.g., Ti/TiN) is deposited. In some embodiments, the conductive bump stop layer 230 is deposited over the outgassing barrier layer 250, the passivation stack 210, the outgassing layer 200, and the via 220.

Figure 5F:
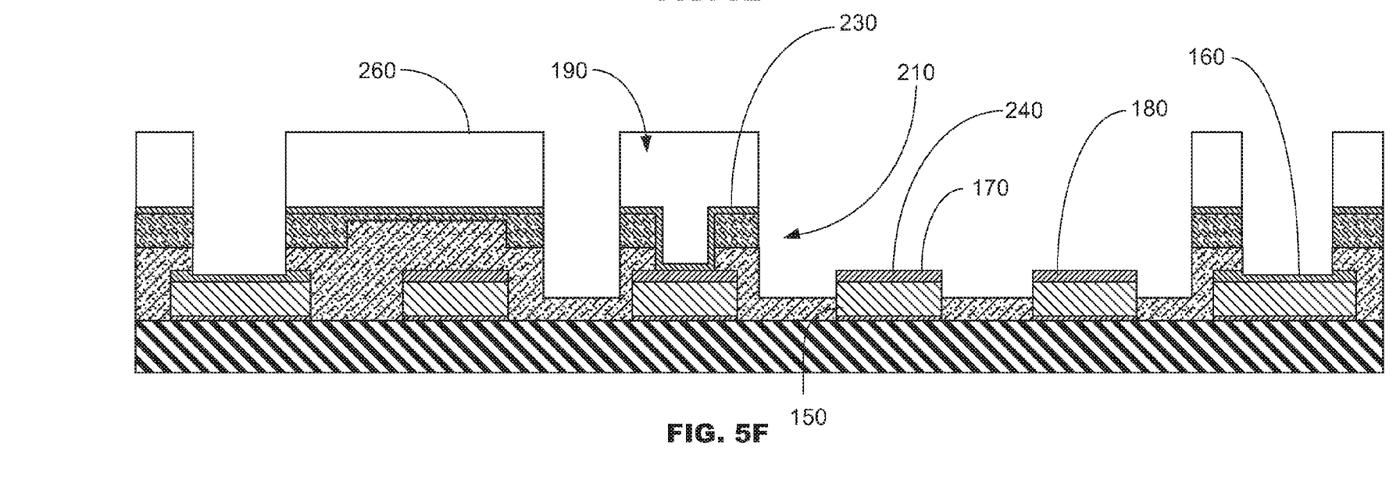
FIG. 5F shows an exemplary process step including lithography and etching in an embodiment of a process flow according to the present disclosure.

In FIG. 5F, a PAD lithography and etch step is performed after the conductive layer 230 deposition. In some embodiments, the PR 260 is deposited on top of the conductive bump stop layer 230 and the passivation stack 210, and patterned. The conductive bump stop layer 230 and the passivation stack 210 (e.g., SiN/SRO/oxide) are selectively etched using the PR mask/pattern. The etch is stopped at the electrode layer 240 on the top metal 150 (e.g., AlCu). In some embodiments, the etch is stopped after removing a portion of the electrode layer 240 of the bonding electrodes 160 (e.g., bonding pads) in the vertical direction. The PAD lithography and etch step defines the final bump stop structure 190 and exposes bonding, shield, and sensing electrodes 160, 170, 180.

Figure 5G:
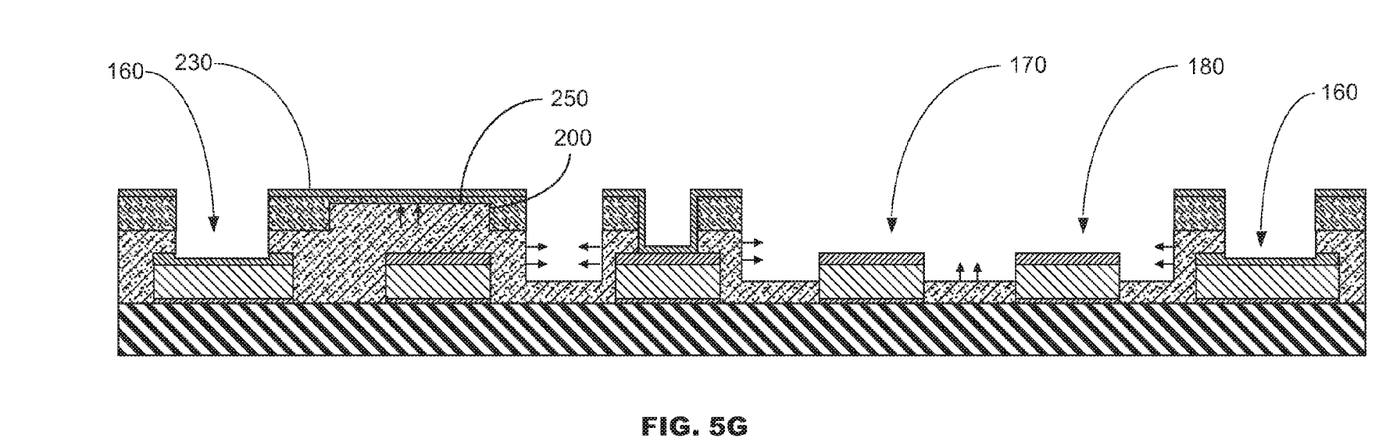
FIG. 5G shows an exemplary process step including a photoresist strip and an alloy step in an embodiment of a process flow according to the present disclosure.

In FIG. 5G, the PR 260 (shown in FIG. 5F) is stripped and the alloy step is performed. During the alloy step, the capping conductive bump stop layer 230 and the outgassing barrier layer 250 partially or completely blocks the outgassing from the outgassing layer 200 (e.g., HDP oxide). The arrows in FIG. 5G indicate the direction of outgassing during the alloy step.

Figure 5H:
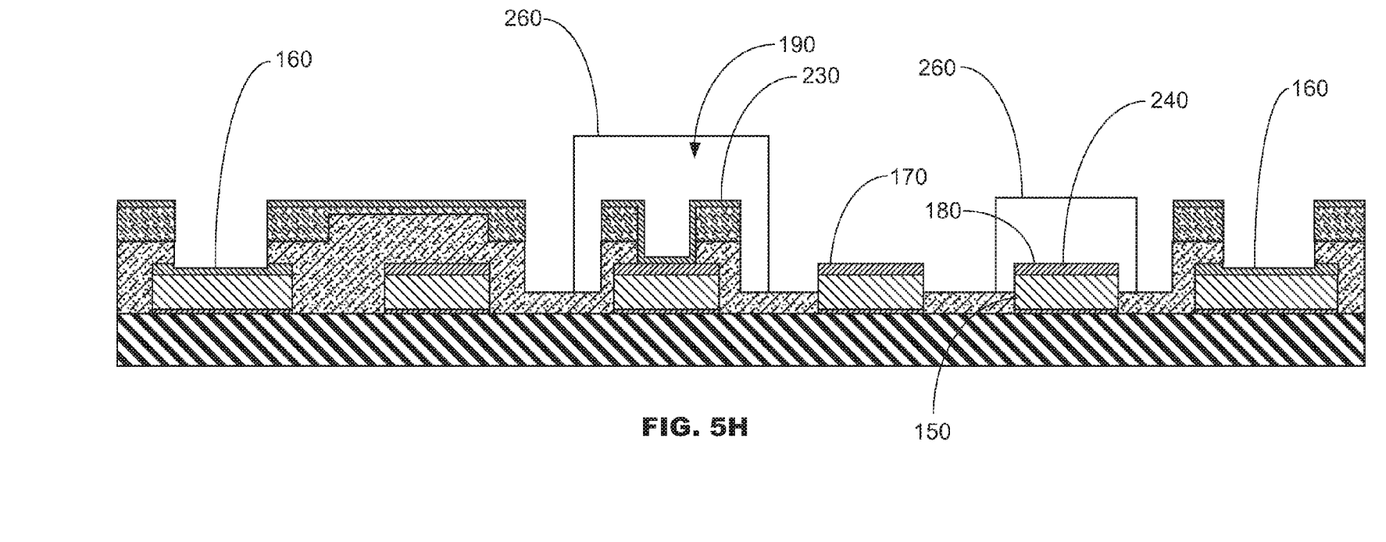
FIG. 5H shows an exemplary process step including lithography in an embodiment of a process flow according to the present disclosure.

In FIG. 5H, lithography is performed for the conductive bump stop layer 230 and the electrode layer 240 on the top metal 150 (e.g., AlCu). In some embodiments, the PR 260 is deposited and patterned to selectively protect the predefined conductive bump stop structures 190 and the electrode layer 240 on AlCu (e.g., top metal layer 150) for defining bonding electrode, or sensing or shield electrodes 160, 170, 180.

Figure 5I:
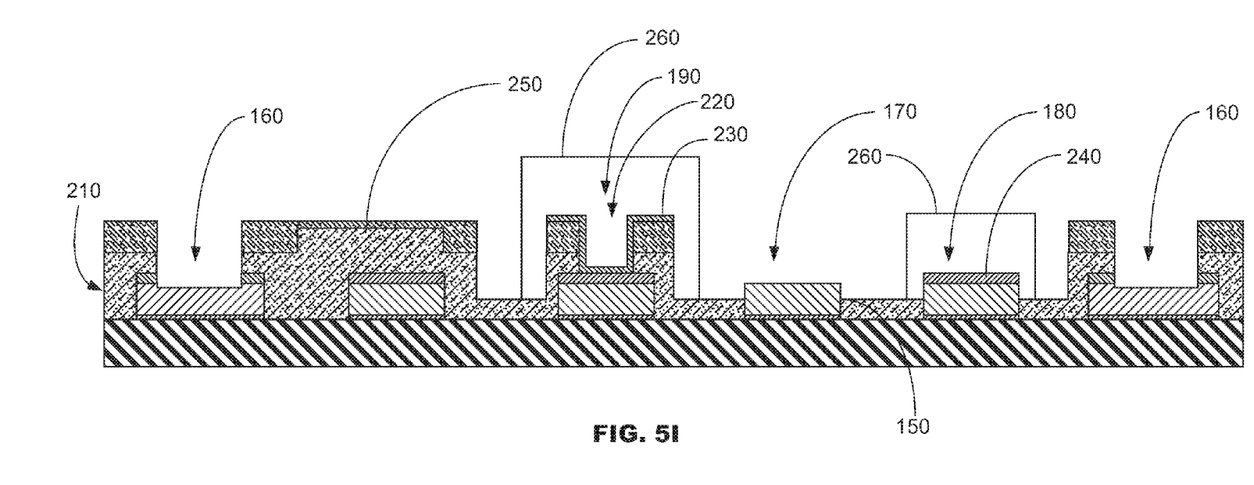
FIG. 5I shows an exemplary process step including etching in an embodiment of a process flow according to the present disclosure.

In FIG. 5I, another etch is performed. In some embodiments, this etch step relates to selectively etching the conductive bump stop layer 230 and the electrode layer 240. In some embodiments, the floating conductive bump stop layer 230 on passivation 210 (not connected to top metal 150 through via 220) is removed. The capping conductive bump stop layer 230 is also removed to expose the outgassing barrier layer 250 underneath. Further, the electrode layer 240 on the top metal layer 150 (e.g., AlCu) is removed to define bonding electrodes 160 and/or shield electrodes 170. The conductive bump stop layer 230 that is part of the conductive bump stop 190 and the electrode layer 240 of the shield/sensing electrode 180 remain.

Figure 5J:
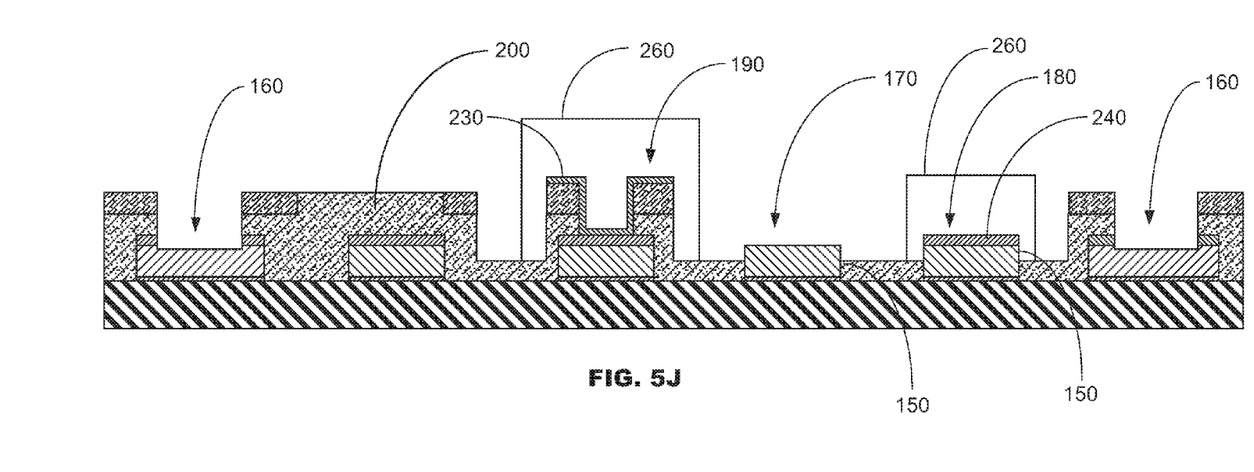
FIG. 5J shows an exemplary process step including etching in an embodiment of a process flow according to the present disclosure.

In FIG. 5J, the outgassing barrier layer 250 (e.g., SiN) is etched. In some embodiments, the PR 260 is maintained from the previous step and the outgassing barrier layer 250, shown in FIG. 5I, is etched to expose the outgassing layer 200 underneath. The conductive bump stop layer 230 of the conductive bump stop 190 and the electrode layer 240 on top of AlCu (e.g., top metal 150) of the shield/sensing electrode 180 are protected by the PR 260 during this step.

Figure 5K:
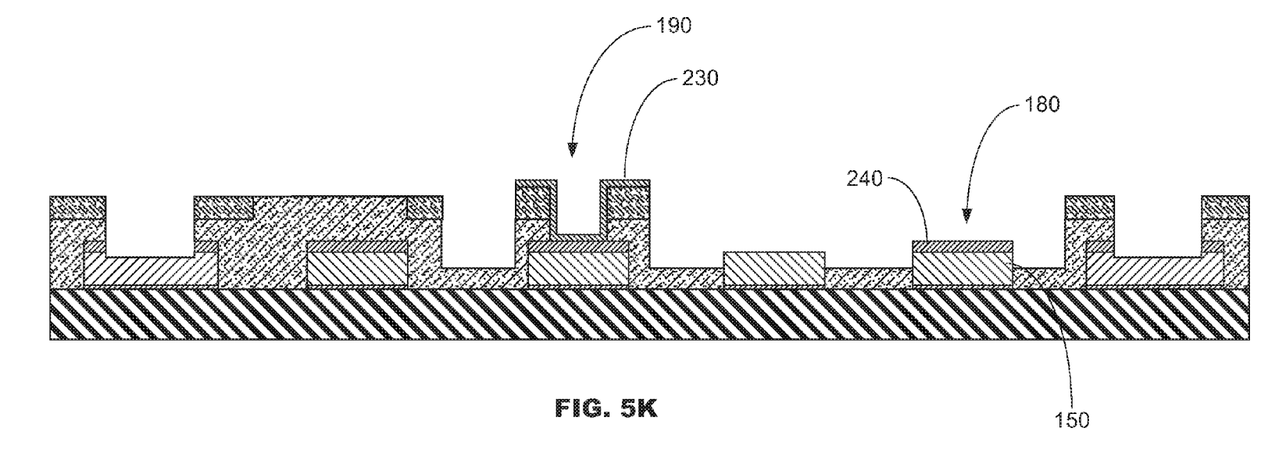
FIG. 5K shows an exemplary process step including a photoresist strip in an embodiment of a process flow according to the present disclosure.

In FIG. 5K, the PR 260 is stripped. In some embodiments, the PR 260, shown in FIG. 5J, that was patterned to selectively protect the conductive bumpstop layer 230 of the conductive bump stop 190 and the electrode layer 240 of the shield/sensing electrode 180 is finally removed.

Figure 5L:
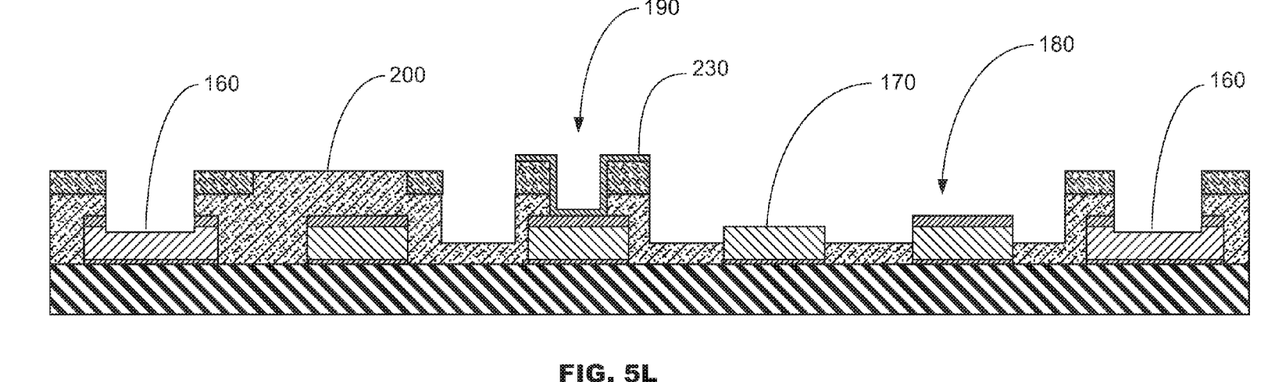
FIG. 5L shows an exemplary process step including readying wafer for bonding in an embodiment of a process flow according to the present disclosure.

After this step, the CMOS wafer 100 as shown in FIG. 5L is ready for bonding with the MEMS wafer.

Some embodiments of the process flow according to the present disclosure are used to make six-axis products such as MEMS devices that include an accelerometer and/or a gyroscope.

Some embodiments of the process flow according to the present disclosure configure a bump stop of the MEMS device to be a conductive bump stop that employs TiN for a charge dissipation path. The process flow can include, for example, providing a passivation stack over a top metal, an outgassing layer, a TiN via/TiN layer, a PAD etch, and an alloy step. In other embodiments, Ti, or TaN, Tungsten can be used for conductive layer of the conductive bumpstop.

Some embodiments of the process flow according to the present disclosure provide an accelerometer and/or gyroscope in a MEMS device with an offset improvement path. The MEMS device provides a stable sensing/shield electrode (e.g., TiN, Ti, etc.) on AlCu. Some embodiments provide that an additional mask is used during an integration scheme to selectively keep or etch the stable electrode on AlCu. This additional step can occur, for example, after each PAD etch.

Some embodiments provide an integration scheme according to the present disclosure to save masks or masking steps by patterning the conductive bump stop layer and electrode layer on AlCu in the same step.

Some embodiments provide for patterning multi-layer on passivation and multi-layer on AlCu in the same step, thereby saving masks or mask steps.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method, comprising:
providing a first conductive layer over a pad of a microelectromechanical system (MEMS) sensor system;
providing a second conductive layer over the pad, over the outgassing layer, and over the bump stop structure;
performing a first etch to remove a portion of the second conductive layer over the pad; and
performing, using a single mask, a second etch to remove a portion of the first conductive layer over the pad and to remove the second conductive layer over the outgassing layer.

2. The method according to claim 1, wherein performing the second etch does not remove the second conductive layer over the bump stop structure.

3. The method according to claim 1, wherein performing the first etch forms a conductive bump stop from the bump stop structure.

4. The method according to claim 1, wherein:
performing the first etch includes performing the first etch to remove a portion of the second conductive layer in a direction that is perpendicular to a substrate, and
the pad and the bumpstop structure are disposed on the substrate.

5. The method according to claim 4, wherein performing the second etch includes performing the second etch to remove a remaining portion of the first conductive layer in the direction that is perpendicular to the substrate.

6. The method according to claim 1, comprising:
providing the first conductive layer over a shield electrode of the MEMS sensor system;
providing the second conductive layer over the shield electrode; and
performing the first etch to remove the second conductive layer over the shield electrode.

7. The method according to claim 1, comprising:
providing the first conductive layer over a sensing electrode of the MEMS sensor system;
providing the second conductive layer over the sensing electrode; and
performing the first etch to remove the second conductive layer over the sensing electrode, wherein the performance of the second etch does not remove the first conductive layer over the sensing electrode.

8. The method according to claim 1, wherein:

performing the second etch exposes the outgassing layer, and performing the first etch does not remove the second conductive layer over the outgassing layer.

9. The method according to claim 1, comprising:

performing alloying between performing the first etch and performing the second etch.

10. The method according to claim 1, comprising:

bonding a MEMS wafer to the pad after the performance of the second etch, wherein the pad is in electrical communication with a substrate that includes a complementary metal oxide semiconductor (CMOS) wafer.

11. The method according to claim 1, comprising:

performing a via etch through the bump stop structure, wherein the second conductive layer is provided over a side surface and over an end surface of the etched via of the bump stop structure.

12. The method according to claim 1, comprising:

providing a passivation stack between the first conductive layer and the second conductive layer, wherein the first etch removes the portion of the second conductive layer and a portion of the passivation stack that are over the pad, sensing and shield electrodes.

13. The method according to claim 1, comprising:

providing a barrier layer over the outgassing layer and under the second conductive layer;

performing alloying between performing the first etch and performing the second etch; and performing a third etch to remove the barrier layer.

14. The method according to claim 13, comprising:

performing alloying between performing the first etch and performing the third etch.

15. The method according to claim 1, where the first conductive layer comprises a third and fourth layers, the second conductive layer comprises a fifth and sixth layers.

16. The method according to claim 15, wherein the third and fifth layers form part of a top layer.

17. The method according to claim 16, comprising:

etching the fourth layer and the sixth layer.

\* \* \* \* \*